United States Patent
Kondoh

(10) Patent No.: US 7,361,920 B2
(45) Date of Patent: Apr. 22, 2008

(54) SUBSTRATE PROCESSING APPARATUS AND TRANSFER POSITIONING METHOD THEREOF

(75) Inventor: Keisuke Kondoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 44 days.

(21) Appl. No.: 11/304,685

(22) Filed: Dec. 16, 2005

(65) Prior Publication Data

US 2006/0138367 A1 Jun. 29, 2006

Related U.S. Application Data

(60) Provisional application No. 60/662,777, filed on Mar. 18, 2005.

(30) Foreign Application Priority Data

Dec. 24, 2004 (JP) .............................. 2004-374955

(51) Int. Cl.
*G01N 21/86* (2006.01)
*G01R 31/26* (2006.01)

(52) U.S. Cl. ........................... 250/559.12; 250/559.33; 438/14

(58) Field of Classification Search ........... 250/559.12, 250/559.36, 559.14, 559.15, 559.32, 559.33; 438/15, 13, 14
See application file for complete search history.

(56) References Cited

U.S. PATENT DOCUMENTS

| 6,144,926 A | * | 11/2000 | Ishizawa et al. | ............... 702/94 |
| 2005/0255609 A1 | | 11/2005 | Kumagai et al. | ............... 438/5 |

FOREIGN PATENT DOCUMENTS

| JP | 2004-174669 | 6/2004 |
| JP | 2004-214462 | 7/2004 |
| KR | 2003-0087225 | 11/2003 |
| WO | WO 2004/048048 A1 | 6/2004 |

* cited by examiner

*Primary Examiner*—Georgia Epps
*Assistant Examiner*—Don Williams
(74) *Attorney, Agent, or Firm*—Oblon, Spivak, McClelland, Maier & Neustadt, P.C.

(57) ABSTRACT

A substrate processing apparatus has a transfer mechanism arranged on a transfer base and configured to transfer a processing substrate between predetermined transfer positions, a mapping sensor arranged on the transfer base and configured to detect an arrangement state of a processing substrate inside a processing substrate accommodating case which accommodates a plurality of processing substrate in a shelf-like form, and a Z-axis teaching jig provided on or in the vicinity of one of the transfer positions. This substrate processing apparatus detects, by the mapping sensor, a height of the Z-axis teaching jig so as to perform teaching of Z-axis to the transfer mechanism with respect to the one of the transfer positions.

8 Claims, 5 Drawing Sheets

SUBSTRATE PROCESSING APPARATUS AND TRANSFER POSITIONING METHOD THEREOF

CROSS-REFERENCE TO THE INVENTION

This application is based upon and claims the benefit of priority from the prior Japanese Patent Application No. 2004-374955, filed on Dec. 24, 2004; and the prior U.S. Patent Provisional Application No. 60/662,777, filed on Mar. 18, 2005; the entire contents of which are incorporated herein by reference.

BACKGROUND OF THE INVENTION

1. Field of the Invention

The present invention relates to a substrate processing apparatus that performs processing such as etching, film-forming, or the like on a processing substrate such as a semiconductor wafer, a glass substrate for a liquid crystal display device or the like, and a transfer positioning method thereof.

2. Description of the Related Art

Conventionally, substrate processing apparatuses are known, which perform processing such as etching, film-forming, or the like on a processing substrate that is a semiconductor wafer, a glass substrate for a liquid crystal display device, or the like. Regarding such substrate processing apparatuses, there is known one having a structure in which modules such as a plurality of vacuum process chambers, a vacuum transfer chamber provided with a transfer mechanism therein, a transfer chamber for transferring a processing substrate in the atmosphere, a mounting part on which a cassette or a FOUP capable of accommodating a plurality of processing substrates is mounted, a positioning mechanism (orienter) which performs positioning of a processing substrate by an orientation flat or a notch, and so on are connected so as to perform efficient processing on a processing substrate.

Since respective parts are modularized in the substrate processing apparatus as described above, positions, heights and so on of respective modules include some errors from design values when these modules are assembled. Accordingly, in the transfer mechanism which transfers a processing substrate between these modules, it is required to perform teaching for storing heights and positions of respective modules which become transfer positions after the apparatus is assembled. As a method of performing such teaching, there is known a method which manually performs, first, rough teaching with rough accuracy of position (accuracy of position of approximately ±2 mm for example) using a dummy substrate, and thereafter performs teaching with high accuracy (accuracy of position of approximately ±0.2 mm for example) using an orienter (refer to Japanese Patent Laid-open Application No. 2004-174669 for example).

In the above-described conventional technique, teaching with high accuracy can be carried out by means of the orienter without depending on visual observation or the like. However, also in this method, when performing the rough teaching or the like for example, there are steps involving visual observation and manual operation by an operator, and thus there is a problem requiring much time and labor in these steps. Also, since the teaching using the orienter is for a horizontal direction, there is a problem such that accuracy of height (Z axis) position cannot be obtained adequately.

SUMMARY OF THE INVENTION

The present invention is made in view of the above-described problems, and is intended for providing a substrate processing apparatus and a transfer positioning method capable of reducing steps involving visual observation and manual operation by an operator during teaching as compared to conventional arts so as to perform teaching efficiently, as well as improving accuracy of height position.

An aspect of the substrate processing apparatus according to the present invention is a substrate processing apparatus having a transfer mechanism arranged on a transfer base and configured to transfer a processing substrate between predetermined transfer positions, a mapping sensor arranged on the transfer base and configured to detect an arrangement state of a processing substrate inside a processing substrate accommodating case which accommodates a plurality of processing substrates in a shelf-like form, and a Z-axis teaching jig provided on or in the vicinity of one of the transfer positions, in which the mapping sensor detects a height of the Z-axis teaching jig so as to perform teaching of Z-axis to the transfer mechanism with respect to the one of the transfer positions.

An aspect of the substrate processing apparatus according to the present invention is the above-described substrate processing apparatus further having a detecting sensor configured to detect a difference between heights of the mapping sensor and a support member supporting a processing substrate of the transfer mechanism.

An aspect of the substrate processing apparatus according to the present invention is the above-described substrate processing apparatus in which the Z-axis teaching jig has a detachable structure.

An aspect of the substrate processing apparatus according to the present invention is the above-described substrate processing apparatus in which the mapping sensor has a light emitting element and a light receiving element, which are arranged to oppose each other with a gap in a horizontal direction, and a height of the Z-axis teaching jig is detected by blocking of light between the light emitting element and the light receiving element by the Z-axis teaching jig when the light emitting element and the light receiving element are moved up and down.

An aspect of the substrate processing apparatus according to the present invention is the above-described substrate processing apparatus in which the transfer positions are a positioning device which performs positioning of a processing substrate and a load lock chamber for transferring the processing substrate into and out of a vacuum chamber.

An aspect of the transfer positioning method for a substrate processing apparatus according to the present invention is a transfer positioning method for a substrate processing apparatus which has a transfer mechanism arranged on a transfer base and configured to transfer a processing substrate between predetermined transfer positions, and a mapping sensor arranged on the transfer base and configured to detect an arrangement state of a processing substrate inside a processing substrate accommodating case which accommodates a plurality of processing substrate in a shelf-like form, the method including providing a Z-axis teaching jig on or in the vicinity of one of the transfer positions, and detecting by the mapping sensor a height of the Z-axis teaching jig so as to perform teaching of Z -axis to the transfer mechanism with respect to the one of the transfer positions.

An aspect of the transfer positioning method for the substrate processing apparatus according to the present invention is the above-described method further including detecting a difference between heights of the mapping sensor and a support member supporting a processing substrate of the transfer mechanism.

An aspect of the transfer positioning method for the substrate processing apparatus according to the present invention is the above-described method in which the Z-axis teaching jig has a detachable structure, and the Z-axis teaching jig is attached when Z-axis teaching is performed and removed after the Z-axis teaching is completed.

DESCRIPTION OF THE EMBODIMENTS

Figure 1:
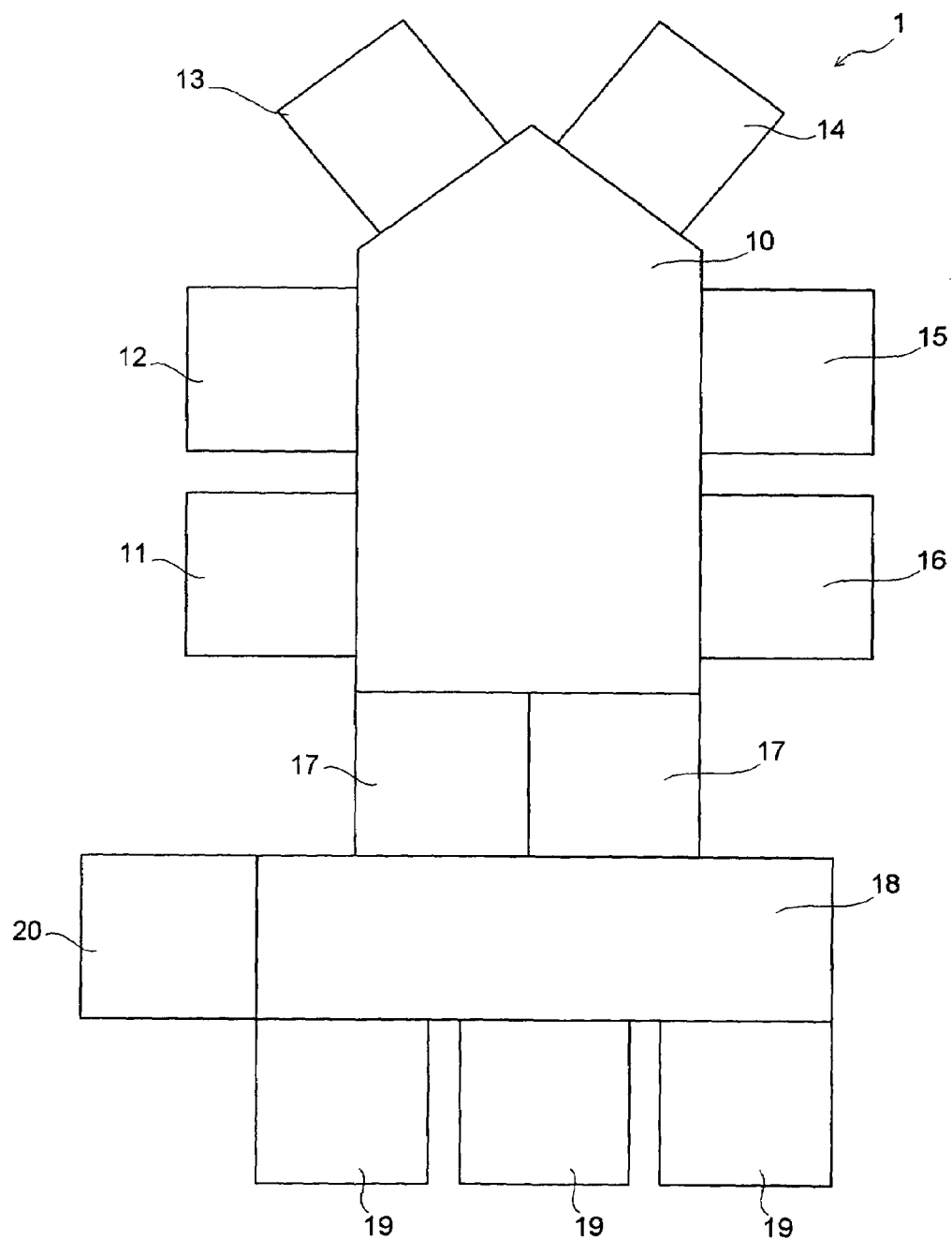
FIG. 1 is a view showing an overall schematic structure of a substrate processing apparatus according to one embodiment of the present invention.

Hereinafter, details of the present invention with respect to one embodiment will be described with reference to the drawings. FIG. 1 is a view showing an overall structure of a substrate processing apparatus according to one embodiment of the present invention. As shown in FIG. 1, at a center part of a substrate processing apparatus 1, a vacuum transfer chamber 10 is provided, and along this vacuum transfer chamber 10, a plurality of (six in this embodiment) vacuum process chambers 11 to 16 are disposed in the vicinity thereof.

On a near side (lower side in the drawing) of the vacuum transfer chamber 10, two load lock chambers 17 are provided. Further, on a nearer side (lower side in the drawing) of these load lock chambers 17, a transfer chamber 18 for transferring a semiconductor wafer W in the atmosphere is provided. Further, on a nearer side (lower side in the drawing) of this transfer chamber 18, a plurality of (three in FIG. 1) mounting parts 19 are provided, on each of which a carrier (FOUP or cassette) as a processing substrate accommodating case capable of accommodating a plurality of semiconductor wafers W is provided. On a side (left side in the drawing) of the transfer chamber 18, a positioning mechanism 20 which performs positioning of a semiconductor wafer W by an orientation flat or a notch is provided.

Figure 2:
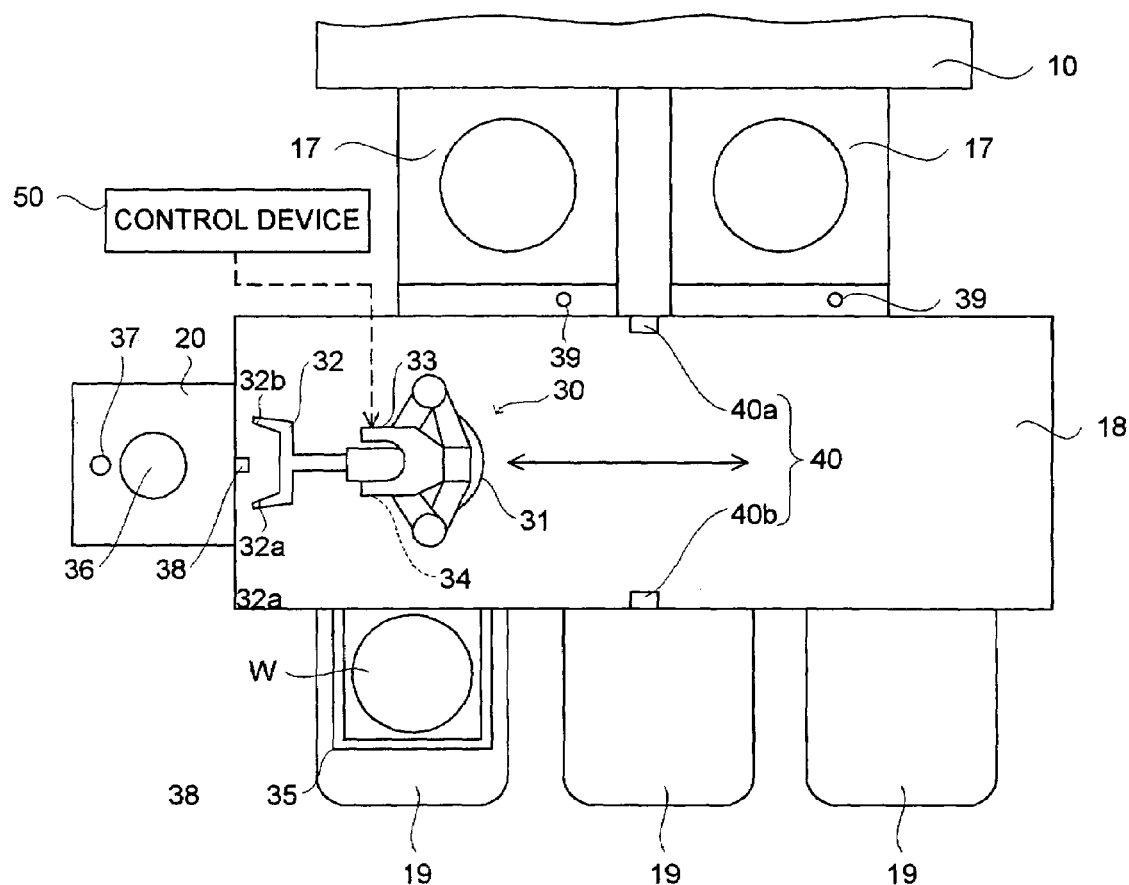
FIG. 2 is a horizontal cross-sectional view showing a structure of a substantial part of the substrate processing apparatus of FIG. 1.
Figure 3:
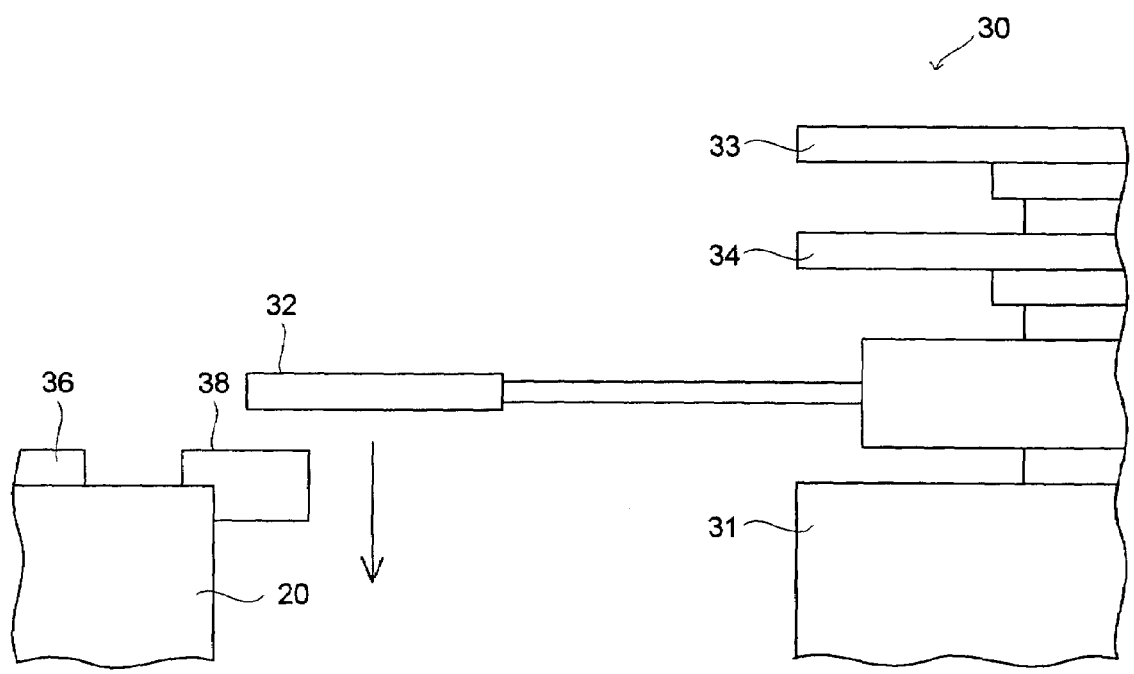
FIG. 3 is a vertical cross-sectional view showing a structure of a substantial part of the substrate processing apparatus of FIG. 1.

As shown in FIG. 2, in the transfer chamber 18, a transfer mechanism 30 for transferring a semiconductor wafer W in the atmosphere is provided. This transfer mechanism 30 is capable of moving along a longitudinal direction (left and right direction in FIG. 2) of the transfer chamber 18 as shown by arrows in the drawing, and is provided on a transfer base 31 capable of moving up and down. On this transfer base 31, as shown in FIG. 3, a mapping sensor 32 is provided on a lower side, and two substrate transfer arms 33, 34 are provided thereabove.

The mapping sensor 32 has a light emitting element 32*a* and a light receiving element 32*b*, which are arranged with a gap in the horizontal direction. Then, by blocking of light between them, existence of an object located therebetween, a semiconductor wafer W for example, and a height thereof and so on are detected. During normal substrate processing, this mapping sensor 32 is used for the purpose of detecting accommodating states of a semiconductor wafer W, namely, at what height position and how the semiconductor wafer W is accommodated in a carrier 35 (FOUP or cassette) mounted on the mounting part 19. In this embodiment, this mapping sensor 32 is used for performing teaching of a height (Z-axis) of a transfer position.

The positioning mechanism 20 is provided with a stage 36 for holding and turning a semiconductor wafer W and an optical sensor 37 for performing positioning by detecting the position of a peripheral portion of a semiconductor wafer W being turned on this stage 36 and a notch or an orientation flat. This positioning mechanism 20 is also provided with a Z-axis teaching jig 38. This Z-axis teaching jig 38 is for performing teaching of a height (Z-axis) of the stage 36, which is a transfer position associated with the transfer mechanism 30, and is arranged at the same height as the stage 36 or arranged so that a difference with the height of the stage 36 is known.

This Z-axis teaching jig 38 is provided so as to protrude from the positioning mechanism 20 inside the transfer chamber 18. This allows the mapping sensor 32 to freely move in an up and down directions, without coming into contact with another structure, at a part of the Z-axis teaching jig 38, and even in a state before performing rough teaching with a positional displacement larger than ±2 mm of accuracy of position, it is possible to perform Z-axis teaching by detecting the height of the stage 36 of the positioning mechanism 20.

Figure 4:
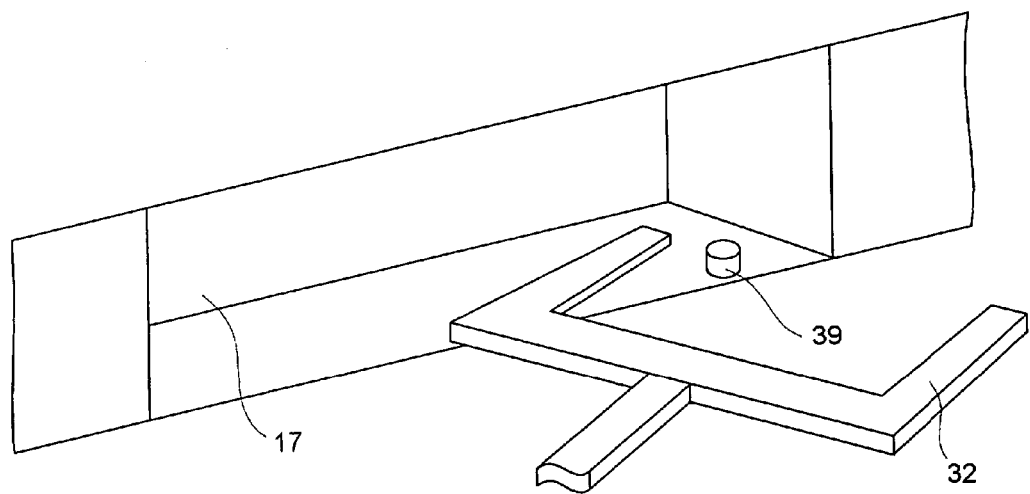
FIG. 4 is a perspective view showing a structure of a substantial part of the substrate processing apparatus of FIG. 1.

Also, in each of the two load lock chambers 17, which are transfer positions to which the transfer mechanism 30 transfers a semiconductor wafer W, a Z-axis teaching jig 39 for performing Z-axis teaching as described above is provided. This Z-axis teaching jig 39 is, as shown in FIG. 4, provided so as to protrude from a lower part of an entrance portion of each load lock chamber 17.

The above-described structure of the Z-axis teaching jig 39 is a result of considering the restriction in range of moving up and down the mapping sensor 32 in the vicinity of the load lock chamber 17, and the extension range of the mapping sensor 32 not reaching inside the load lock chamber 17. However, when a certain degree of a range of moving up and down the mapping sensor 32 in the vicinity of the load lock chamber 17 can be secured, the Z-axis teaching jig 39 may have the same structure as the aforementioned Z-axis teaching jig 38. Also, when the mapping censor 32 can extend inside the load lock chamber 17, the Z-axis teaching jig 39 may be provided inside the load lock chamber 17. Furthermore, a Z-axis teaching jig with a different shape may be provided at another location, and the shape and the arranging position thereof are not limited to those in the above-described embodiment.

These Z-axis teaching jig 38 and Z-axis teaching jig 39 are freely detachable, and they are attached when Z-axis teaching is performed and removed after the Z-axis teaching is completed. However, if the Z-axis teaching jigs can be provided so that they do not become obstruction when performing normal processing, they may be provided with a fixed structure.

As shown in FIG. 2, in the transfer chamber 18, there is provided an arm position detecting sensor 40 constituted of a light emitting unit 40*a* and a light receiving unit 40*b*, which are arranged respectively on opposing side wall parts. Then, the transfer base 31 is stopped at the position of this arm position detecting sensor 40, and by moving up and down the transfer base 31 here, a difference can be detected between heights of the mapping sensor 32 provided on this transfer base 31 and substrate support members (end-effectors) of the substrate transfer arm 33 and the substrate transfer arm 34.

Figure 5:
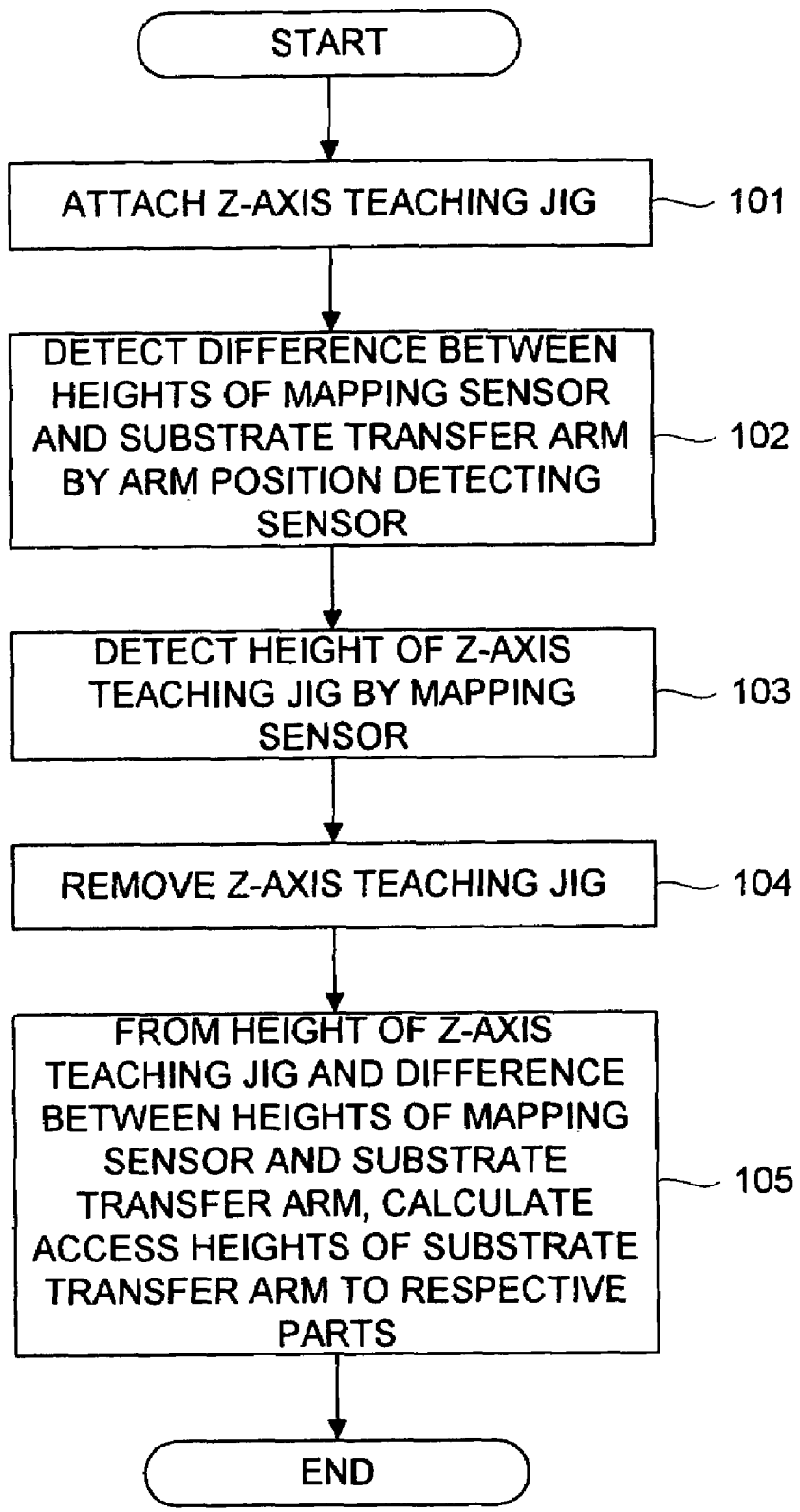
FIG. 5 is a flowchart for explaining a transfer positioning method according to the one embodiment of the present invention.

Next, a teaching method of Z-axis for the substrate processing apparatus 1 having the above-described structure will be described with reference to a flowchart of FIG. 5.

When performing teaching of Z-axis, first, the Z-axis teaching jig 38 and the Z-axis teaching jig 39 are attached to predetermined respective transfer positions which require teaching of Z-axis, namely, the positioning mechanism 20 and the two load lock chambers 17 (101).

Next, the transfer base 31 is arranged at the position of the arm position detecting sensor 40, and by the arm position detecting sensor 40, a difference is detected between heights of the mapping sensor 32 and the substrate support members (end-effectors) of the substrate transfer arm 33 and the substrate transfer arm 34 (102).

Thereafter, heights of the Z-axis teaching jig 38 and the Z-axis teaching jig 39 are detected by the mapping sensor 32 (103).

Thereafter, the Z-axis teaching jig 38 and the Z-axis teaching jig 39 are removed (104).

Then, access heights of the substrate transfer arm 33 and the substrate transfer arm 34 to the respective transfer positions are calculated from the heights of the Z-axis teaching jig 38 and the Z-axis teaching jig 39 detected by the mapping sensor 32 and the difference between the heights of the mapping sensor 32 and the substrate support members (end-effectors) of the substrate transfer arm 33 and the substrate transfer arm 34 detected by the arm position detecting sensor 40 (105). Coordinate values of these access heights are stored in a control device 50 shown in FIG. 2, which controls operation of the transfer mechanism 30, and then the teaching is performed.

As above, the Z-axis teaching to the transfer mechanism 30 with respect to the positioning mechanism 20 and the two load lock chambers 17 is completed. Note that regarding a not-shown dummy wafer accommodating unit and the mounting parts 19, Z-axis teaching can be performed with a dummy wafer without using the Z-axis teaching jigs, and therefore, in each of these parts, a carrier accommodating a dummy wafer is arranged. Then, similarly to the above-described Z-axis teaching, the height of a dummy wafer is detected with the mapping sensor 32, and then the Z-axis teaching is performed.

When the dummy wafer can be transferred to each part along a predetermined transfer path with only the above-described Z-axis teaching, a displacement in the horizontal direction of the dummy wafer transferred from each part is detected by the positioning mechanism 20, thereby performing teaching in the horizontal direction. Specifically, for example, a dummy wafer arranged in a predetermined position in the carrier 35 of a mounting part 19 is transferred to the positioning mechanism 20 by the transfer mechanism 33, thereby measuring a positional displacement in the horizontal direction of the dummy wafer. Then, teaching of corrected values for coordinate values calculated so as to eliminate the amount of the positional displacement is performed. Here, in a case that there is a position to which the dummy wafer cannot be transferred by only the Z-axis teaching, rough teaching in the horizontal direction is performed for only that position, and thereafter teaching using the positioning mechanism 20 is performed.

Thus, steps involving visual observation and manual operation by an operator can be reduced so as to perform teaching efficiently, and thus accuracy of height position can be improved.

Next, operation of substrate processing in the substrate processing apparatus 1 of this embodiment with the above-described structure will be described. When a cassette or a FOUP is mounted on a mounting part 19, a semiconductor wafer W is taken out from this cassette or FOUP by a not-shown transfer mechanism provided inside the transfer chamber 18, transferred to the positioning mechanism 20 and positioned, and thereafter arranged in a load lock chamber 17.

Then, by a not-shown transfer mechanism provided in the vacuum transfer chamber 10, the semiconductor wafer W is moved from the load lock chamber 17 to each of the vacuum process chambers 11 to 16 for being subjected to predetermined processing. Also, the semiconductor wafer W after completing processing is transferred by this transfer mechanism from each of the vacuum process chambers 11 to 16 and arranged in the load lock chamber 17.

The processed semiconductor wafer W arranged in the load lock chamber 17 as described above is taken out thereafter from the load lock chamber 17 by the transfer mechanism inside the transfer chamber 18, and is accommodated in the cassette or FOUP mounted on the mounting part 19.

When substrate processing as described above is performed, transfer of a semiconductor wafer W can be performed with higher accuracy of height position as compared to conventional arts, by the transfer mechanism 30 inside the transfer chamber 18, among the cassette or FOUP mounted on the mounting part 19, the positioning mechanism 20, the load lock chamber 17, and so on.

What is claimed is:

1. A substrate processing apparatus, comprising:
    a transfer mechanism arranged on a transfer base in a transfer chamber and configured to transfer a processing substrate between predetermined transfer positions;
    a mapping sensor arranged on the transfer base and configured to detect an arrangement state of a processing substrate inside a processing substrate accommodating case which accommodates a plurality of processing substrates in a shelf-like form; and
    a Z-axis teaching jig protruding inside said transfer chamber and provided on or in the vicinity of one of the transfer positions,
    wherein said mapping sensor detects a height of said Z-axis teaching jig so as to perform teaching of Z-axis to said transfer mechanism with respect to the one of the transfer positions.

2. The substrate processing apparatus as set forth in claim 1, further comprising:
    a detecting sensor configured to detect a difference between heights of said mapping sensor and a support member supporting a processing substrate of said transfer mechanism.

3. The substrate processing apparatus as set forth in claim 1, wherein said Z-axis teaching jig has a detachable structure.

4. The substrate processing apparatus as set forth in claim 1,
    wherein said mapping sensor comprises a light emitting element and a light receiving element, which are arranged to oppose each other with a gap in a horizontal direction; and
    wherein a height of said Z-axis teaching jig is detected by blocking of light between the light emitting element and the light receiving element by said Z-axis teaching jig when the light emitting element and the light receiving element are moved up and down.

5. The substrate processing apparatus as set forth in claim 1,
    wherein the transfer positions are a positioning device which performs positioning of a processing substrate and a load lock chamber for transferring the processing substrate into and out of a vacuum chamber.

6. A transfer positioning method for a substrate processing apparatus which comprises a transfer mechanism arranged on a transfer base in a transfer chamber and configured to transfer a processing substrate between predetermined transfer positions, and a mapping sensor arranged on the transfer base and configured to detect an arrangement state of a processing substrate inside a processing substrate accommodating case which accommodates a plurality of processing substrate in a shelf-like form, the method comprising:

provinding a Z-axis teaching jig protruding inside said transfer chamber on or in the vicinity of one of the transfer positions; and detecting by the mapping sensor a height of the Z-axis teaching jig so as to perform teaching of Z-axis to the transfer mechanism with respect to the one of the transfer positions.

7. The transfer positioning method for the substrate processing apparatus as set forth in claim 6, further comprising:

detecting a difference between heights of the mapping sensor and a support member supporting a processing substrate of the transfer mechanism.

8. The transfer positioning method for the substrate processing apparatus as set forth in claim 6, wherein the Z-axis teaching jig has a detachable structure, and the Z-axis teaching jig is attached when Z-axis teaching is performed and removed after the Z-axis teaching is completed.

* * * * *